(12) United States Patent
Kim et al.

(10) Patent No.: US 8,293,566 B1
(45) Date of Patent: Oct. 23, 2012

(54) STRAINED LAYER SUPERLATTICE FOCAL PLANE ARRAY HAVING A PLANAR STRUCTURE

(75) Inventors: Jin K. Kim, Albuquerque, NM (US); Malcolm S. Carroll, Albuquerque, NM (US); Aaron Gin, Albuquerque, NM (US); Phillip F. Marsh, Lowell, MA (US); Erik W. Young, Albuquerque, NM (US); Michael J. Cich, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 35 days.

(21) Appl. No.: 12/815,714

(22) Filed: Jun. 15, 2010

Related U.S. Application Data (62) Division of application No. 11/840,263, filed on Aug. 17, 2007, now Pat. No. 7,755,079.

(51) Int. Cl.
*H01L 21/00* (2006.01)

(52) U.S. Cl. ...... 438/93; 438/128; 257/18; 257/E31.059

(58) Field of Classification Search .......... None
See application file for complete search history.

(56) References Cited

U.S. PATENT DOCUMENTS

| | | | | |
|---|---|---|---|---|
| 4,607,272 A * | 8/1986 | Osbourn | ............ | 257/18 |
| 4,616,241 A * | 10/1986 | Biefeld et al. | ............ | 257/18 |
| 4,684,969 A * | 8/1987 | Taguchi | ............ | 257/438 |
| 4,772,924 A * | 9/1988 | Bean et al. | ............ | 257/19 |
| 5,023,685 A * | 6/1991 | Bethea et al. | ............ | 257/21 |
| 5,065,205 A * | 11/1991 | Biefeld et al. | ............ | 257/18 |
| 5,580,795 A | 12/1996 | Schimert et al. | | |
| 6,222,200 B1 * | 4/2001 | Svilans | ............ | 257/18 |
| 2005/0168127 A1 * | 8/2005 | Shei et al. | ............ | 313/487 |
| 2006/0138580 A1 * | 6/2006 | Kim et al. | ............ | 257/461 |

OTHER PUBLICATIONS

Gail J. Brown, "Type-II InAs/GaInSb Superlattices for infrared Detection: an Overview", Proc of SPIE, vol. 5783, 2005, pp. 65-77.
Robert Rehm et al, "InAs/(GaIn)Sb short-period superlattices for focal plane arrays", Proc. of SPIE, vol. 5783, 2005, pp 123-130.
Jon C. Lee et al, "Investigation of Sensitivity Improvement on Passive Voltage Contrast for Defect Isolation," Microelectronics Reliability, vol. 42, 2002, pp. 1707-1710.
A. Rogalski, "Competitive technologies for third generation infrared photon detectors", Proc. of SPIE, vol. 6206, 2006, pp. 62060S-1-15.

* cited by examiner

*Primary Examiner* — Evan Pert
*Assistant Examiner* — Vongsavanh Sengdara
(74) *Attorney, Agent, or Firm* — Olivia J. Tsai (57) ABSTRACT

An infrared focal plane array (FPA) is disclosed which utilizes a strained-layer superlattice (SLS) formed of alternating layers of InAs and $In_xGa_{1-x}Sb$ with $0 \leq x \leq 0.5$ epitaxially grown on a GaSb substrate. The FPA avoids the use of a mesa structure to isolate each photodetector element and instead uses impurity-doped regions formed in or about each photodetector for electrical isolation. This results in a substantially-planar structure in which the SLS is unbroken across the entire width of a 2-D array of the photodetector elements which are capped with an epitaxially-grown passivation layer to reduce or eliminate surface recombination. The FPA has applications for use in the wavelength range of 3-25 μm.

10 Claims, 4 Drawing Sheets

STRAINED LAYER SUPERLATTICE FOCAL PLANE ARRAY HAVING A PLANAR STRUCTURE

This is a division of application Ser. No. 11/840,263 filed on Aug. 17, 2007, now U.S. Pat. No. 7,755,079.

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to infrared photodetectors, and in particular to focal plane array photodetectors which can form an image of a scene of view using infrared light.

BACKGROUND OF THE INVENTION

Conventional mid-infrared focal plane arrays are based on the use of mercury-cadmium-telluride (HgCdTe) photodetectors. Alternatives to HgCdTe photodetectors are being developed which promise operation at higher temperatures and a detectivity comparable to or better than the HgCdTe photodetectors. Among these alternatives are photodetectors formed from antimonide-based type-II superlattices in which there is, at least theoretically, a promise of longer intrinsic carrier lifetimes due to the suppression of Auger recombination. Additionally, the antimonide-based type-II superlattices have a staggered band alignment which allows both the energy band structure and the energy bandgap of the superlattice to be tailored to enhance detector performance for the absorption of infrared light over a wide wavelength range of about 3 to 25 microns ($\mu m$) or more. The development of infrared focal plane arrays including devices using antimonide-based type-II superlattice photodetectors has been reviewed in an article by A. Rogalski entitled "Competitive Technologies for Third Generation Infrared Photon Detectors" in *Proceedings of the Society of Photo-Optical Instrumentation Engineers (SPIE)*, vol. 6206, 62060S (2006). Another review of type-II superlattice photodetectors can be found in an article by G. J. Brown entitled "Type-II InAs/GaInSb Superlattices for Infrared Detection: an Overview" in *Proceedings of the Society of Photo-Optical Instrumentation Engineers (SPIE)*, vol. 5783, pp. 65-77 (2005).

The present invention provides an advance over the art in the development of antimonide-based type-II superlattice photodetectors by providing a substantially planar geometry for a two-dimensional (2-D) array of photodetectors with a plurality of III-V compound semiconductor layers therein being contiguous (i.e. connecting without a break) across all of the photodetector elements in the 2-D array.

The substantially planar geometry of the infrared focal plane array photodetector of the present invention eliminates a need for etching a mesa structure about each photodetector element which is prevalent in the prior art, and also avoids edge surface recombination which occurs at sidewalls of each photodetector element in the prior art etched mesa structure where the superlattice and a semiconductor junction therein are exposed.

Additionally, the infrared focal plane array photodetector of the present invention avoids a need for epitaxial re-growth which is complicated and time consuming, and which requires careful attention to detail to remove any surface oxide' prior to the re-growth.

These and other advantages of the present invention will become evident to those skilled in the art.

SUMMARY OF THE INVENTION

The present invention relates to an infrared focal plane array (FPA) photodetector which comprises a III-V compound semiconductor substrate (e.g. GaSb or GaAs) having a plurality of III-V compound semiconductor layers epitaxially grown thereon, with the III-V compound semiconductor layers including a buffer layer, a strained-layer superlattice (SLS), and a contact layer. A substantially-planar passivation layer is provided above the plurality of III-V compound semiconductor layers and is etched to provide a two-dimensional (2-D) array of spaced-apart openings therethrough, with each opening defining the location of a photodetector element which is formed from the plurality of III-V compound semiconductor layers. Each photodetector element can be electrically isolated from the remaining photodetector elements by an impurity-doped region (e.g. comprising ion-implanted Be or Te) which extends downward through the contact layer and at least partway into the SLS. The impurity-doped region at an interface with the contact and SLS layers forms a reverse-biased semiconductor p-n junction which electrically isolates that photodetector element from adjacent photodetector elements.

An electrode can be deposited over the contact layer at the location of each photodetector element to electrically contact that photodetector element. Another electrode can be provided in the FPA, with this electrode being connected to the III-V compound semiconductor substrate or to the SLS to form a common electrical connection to each photodetector element.

The III-V compound semiconductor substrate can comprise gallium antimonide (GaSb) or gallium arsenide (GaAs), and can have a thickness of about 200 $\mu m$ or less. The buffer layer can comprise GaSb, aluminum gallium antimonide (AlGaSb) or aluminum gallium arsenide antimonide (AlGaAsSb). The substantially-planar passivation layer can also comprise GaSb, AlGaSb or AlGaAsSb.

The SLS located above the buffer layer can comprise a plurality of alternating layers of indium arsenide (InAs) and indium gallium antimonide ($In_xGa_{1-x}Sb$) with an indium content x in the range $0 \leq x \leq 0.5$. A semiconductor p-n or p-i-n junction is formed in or about the SLS, with the SLS being contiguous across the entire 2-D array of photodetector elements. The SLS can have an overall thickness which is generally 20 $\mu m$ or less. The SLS includes a first-grown portion (i.e. a first-grown set of InAs and $In_xGa_{1-x}Sb$ layers) which are doped with a first doping type; and a last-grown portion (i.e. a last-grown set of InAs and $In_xGa_{1-x}Sb$ layers) which are doped with a second doping type (e.g. n-type doping when the first doping type is p-type doping, or p-type doping when the first doping type is n-type doping) to form the semiconductor p-n or p-i-n junction. Additionally, the SLS can include an intrinsic region (i.e. a not intentionally doped set of InAs and $In_xGa_{1-x}Sb$ layers) located between the first-grown and last-grown sets of the InAs and $In_xGa_{1-x}Sb$ layers. A contact layer, which is located above the SLS, can comprise InAs or GaSb.

The present invention further relates to an infrared FPA photodetector which comprises a III-V compound semiconductor substrate which is doped with a first doping type; a plurality of epitaxial layers grown on the III-V compound semiconductor substrate; a substantially-planar passivation layer formed of GaSb, AlGaSb or AlGaAsSb located above the plurality of epitaxial layers, with the substantially-planar passivation layer being etched to provide a two-dimensional (2-D) array of spaced-apart openings extending therethrough, with each opening defining the location of a photodetector element in the infrared FPA photodetector which is formed from the plurality of epitaxial layers; an impurity-doped region of a second doping type located below each opening; an electrode deposited in each opening in the substantially-planar passivation layer to provide an electrical connection to the photodetector element located therebeneath; and another electrode supported on the III-V compound semiconductor substrate to provide a common electrical connection to each photodetector element.

The plurality of epitaxial layers in epitaxial growth order include a buffer layer (e.g. GaSb, AlGaSb or AlGaAsSb) which is doped with the first doping type; an SLS formed from alternating layers of InAs and $In_xGa_{1-x}Sb$ with $0 \leq x \leq 0.5$; and a contact layer comprising InAs or GaSb. The impurity-doped region extends downwards through the contact layer and partway into the SLS which is contiguous across all of the photodetector elements in the infrared focal plane array photodetector. A last-grown portion of the SLS can be doped (either intentionally or not intentionally) to a level of about $10^{16}$ cm$^{-3}$ or less to allow localized doping of this last-grown portion by the impurity-doped region to form a semiconductor p-n or p-i-n junction in the SLS at the location of each photodetector element.

The present invention also relates to an infrared FPA photodetector which comprises a III-V compound semiconductor substrate with a plurality of III-V compound semiconductor layers epitaxially grown on the substrate including a buffer layer (e.g. GaSb, AlGaSb or AlGaAsSb), an SLS comprising alternating layers InAs and $In_xGa_{1-x}Sb$ with $0 \leq x \leq 0.5$, and a contact layer (e.g. InAs or GaSb). The III-V compound semiconductor layers are doped to form a semiconductor junction (e.g. a p-n or p-i-n junction) therein. A two-dimensional (2-D) array of photodetector elements is formed from the plurality of III-V compound semiconductor layers, with each photodetector element being electrically isolated from the remaining photodetector elements, and with the SLS being contiguous across the entire 2-D array of photodetector elements. A separate electrode (e.g. Ti/Pt/Au) is deposited above the plurality of III-V compound semiconductor layers to provide an independent electrical connection to each photodetector element; and another electrode (e.g. Ti/Pt/Au) is deposited in electrical contact with the III-V compound semiconductor substrate or in electrical contact with the SLS to provide a common electrical connection to each photodetector element.

In some embodiments of the present invention, each photodetector element is electrically isolated from the remaining photodetector elements by an impurity-doped region which extends downward through the contact layer and into the SLS, with the impurity-doped region having a doping type which is opposite the doping type of the contact layer. In these embodiments of the present invention, a substantially-planar passivation layer can be epitaxially grown above the plurality of III-V compound semiconductor layers and etched to provide an opening therethrough at the location of each photodetector element. The passivation layer can comprise GaSb, AlGaSb or AlGaAsSb.

In other embodiments of the present invention, each photodetector element is electrically isolated from the remaining photodetector elements by an impurity-doped region which is formed about each photodetector element and which extends downward through the contact layer and into the SLS between each adjacent pair of the photodetector elements. In these embodiments, the impurity-doped region has a doping type which is opposite the doping type of the contact layer.

The present invention further relates to a method for fabrication of an infrared focal plane array photodetector having a two-dimensional (2-D) array of photodetector elements. The method comprises the steps of epitaxially growing a plurality of III-V compound semiconductor layers on a GaSb substrate including a buffer layer (e.g. GaSb, AlGaSb or AlGaAsSb), a strained-layer superlattice (SLS) comprising a plurality of alternating layers of InAs and $In_xGa_{1-x}Sb$ with $0 \leq x \leq 0.5$; and a contact layer (e.g. InAs or GaSb); electrically isolating each photodetector element from the remaining photodetector elements in the 2-D array of photodetector elements while maintaining the SLS contiguous (i.e. unbroken by etching) across the entire 2-D array of photodetector elements by selectively doping a portion of the III-V compound semiconductor layers within or about each photodetector element; depositing an electrode above the contact layer to independently electrically contact each photodetector element in the 2-D array of photodetector elements; and depositing another electrode proximate to the GaSb substrate to form a common electrical connection to each photodetector element in the 2-D array of photodetector elements. The method can also include steps of epitaxially growing a passivation layer (e.g. GaSb AlGaSb or AlGaAsSb) above the plurality of III-V compound semiconductor layers, and etching an opening through the passivation layer at the location of each photodetector element.

The GaSb substrate can be doped with a first doping type, and can be thinned to a thickness of less than or equal to 200 μm. The step of epitaxially growing the plurality of III-V compound semiconductor layers can comprise doping the buffer layer with the first doping type, and doping the contact layer with a second doping type. The step of epitaxially growing the plurality of III-V compound semiconductor layers can comprise doping a first-grown portion of the strained-layer superlattice with the first doping type, and doping a last-grown portion of the strained-layer superlattice with the second doping type.

The step of selectively doping the portion of the plurality of III-V compound semiconductor layers can comprise ion implanting an impurity dopant into the portion of the plurality of III-V compound semiconductor layers. The ion implanted impurity dopant can then be annealed, if needed, at a temperature of about 450° C. or less. This annealing can be used to diffuse the impurity dopant downward into the plurality of III-V compound semiconductor layers to or partially through the SLS.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1A:
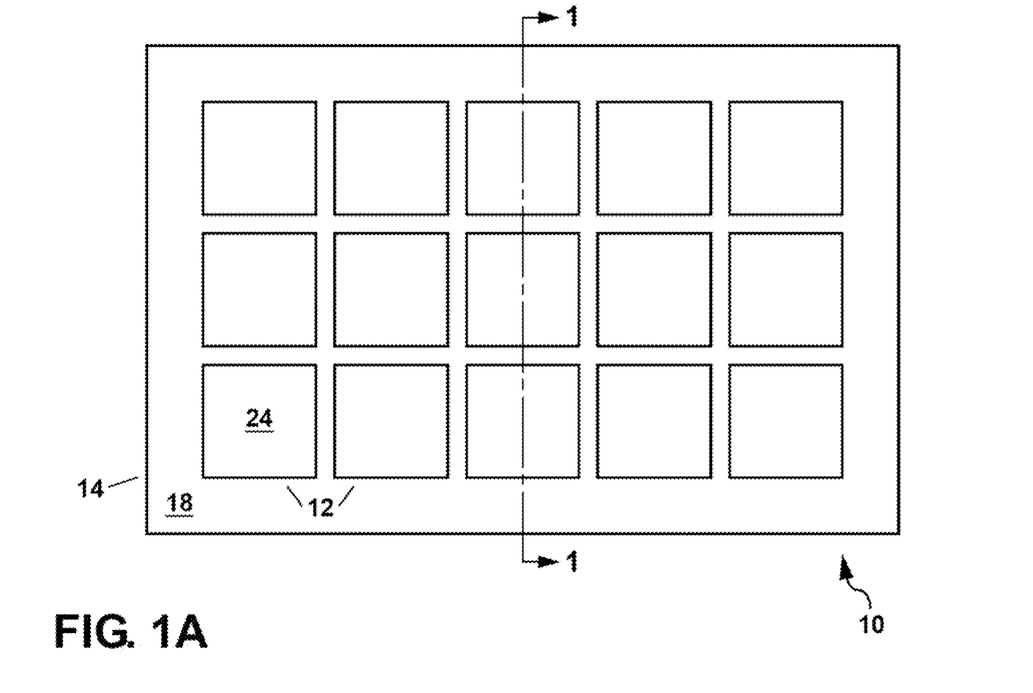
FIG. 1A shows a schematic plan view of a first example of an infrared focal plane array photodetector of the present invention.
Figure 1B:
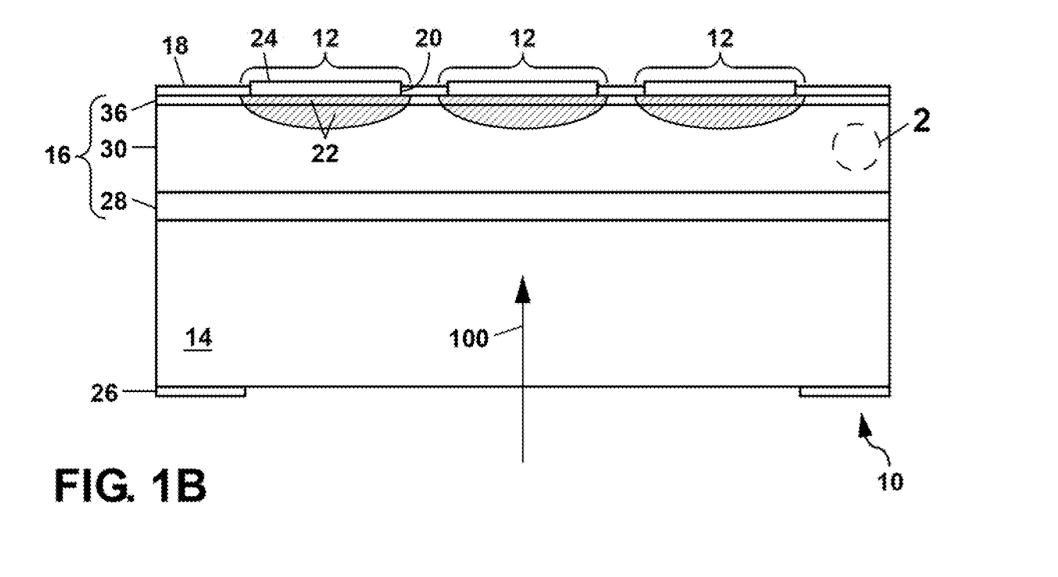
FIG. 1B shows a schematic cross-section view of the device of FIG. 1A along the section line 1-1 in FIG. 1A.

FIGS. 1A and 1B show schematic plan and cross-section views, respectively, of a first example of an infrared focal plane array (FPA) photodetector 10 (also referred to herein as a focal plane array, or simply an FPA) formed according to the present invention. Although the FPA 10 in FIG. 1A is shown with only a few photodetector elements 12 for simplicity, those skilled in the art will understand that the FPA 10 can include up to one million or more individual photodetector elements 12 arranged as a two-dimensional (2-D) array. The lateral dimensions of each photodetector element 12 can be, for example, 50 µm or smaller. Generally the photodetector elements 12 will be formed with a square or rectangular shape in plan view although other shapes are possible.

The FPA 10 in FIGS. 1A and 1B comprises a III-V compound semiconductor substrate 14 upon which a plurality of III-V compound semiconductor layers 16 are epitaxially grown to form the photodetector elements 12. A substantially-planar passivation layer 18 is located above the III-V compound semiconductor layers 16. An opening 20 is provided through the passivation layer 18 to define the location of each photodetector element 12. The passivation layer 18 can also define the location of an impurity-doped region 22 which selectively dopes the plurality of III-V compound semiconductor layers 16 to form a semiconductor p-n or p-i-n junction therein. Since the semiconductor p-n or p-i-n junction has no exposed surfaces due to the presence of the passivation layer 18, which can be epitaxially grown, surface recombination can be greatly reduced in the substantially planar FPA 10 of the present invention.

The substantially planar structure of the photodetector 10 in FIGS. 1A and 1B is in contrast to conventional infrared focal plane arrays which use a non-planar mesa structure for the photodetector elements. Such a mesa structure has etched sidewalls which results in the semiconductor junction of each photodetector element being exposed; and this degrades performance due to surface recombination. Post processing including re-growth is then required to cover the exposed semiconductor junction to mitigate against the surface recombination. This can be problematic, and can affect the reproducibility and long-term stability of the infrared focal plane array. The present invention overcomes these disadvantages of the prior art by avoiding the use of a mesa structure, or any etching down into the SLS 30. Instead, the present invention described herein maintains the SLS 30 contiguous over the entire extent of the 2-D array of photodetector elements 12.

Returning to FIGS. 1A and 1B, an electrode 24 can be deposited in each opening 20 to electrically contact the photodetector element 12 therein after the impurity-doped region 22 has been formed. Another electrode 26 can be provided above or below the III-V compound semiconductor substrate 14 to provide a common electrical connection to each photodetector element 12. Each electrode can comprise layers of titanium, platinum and gold with an overall layer thickness of about 200 nanometers.

Although, the electrode 26 is shown in FIG. 1B as being located on a lower surface of the substrate 14, in other embodiments of the present invention, the electrode 26 can be deposited on an upper surface of the substrate 14, on the buffer layer 28, on a lower contact layer (not shown) which can be epitaxially grown between the buffer layer 28 and the SLS 30, or even on a bottom portion of the SLS 30 itself. In these embodiments of the present invention, a region outside the 2-D array of photodetector elements 12 can be etched down to wherever the electrode 26 is to be deposited. Since this etching will generally be performed outside the photodetector elements 12, the etching need not expose the semiconductor p-n or p-i-n junction of any of the photodetector elements 12 so that surface recombination will not be a problem.

In the example of FIGS. 1A and 1B, the substrate 14 can comprise a gallium antimonide (GaSb) or gallium arsenide (GaAs) substrate. The substrate 14 can be undoped (i.e. not intentionally doped). Alternately, the substrate 14 can be doped p-type using a p-type dopant such as zinc (Zn) or beryllium (Be). Other p-type dopants for III-V compound semiconductors that can be used include magnesium (Mg) and cadmium (Cd). In other embodiments of the present invention, an n-type-doped substrate 14 can be used. N-type dopants for III-V compound semiconductors that can be used include silicon (Si), germanium (Ge), tin (Sn), sulfur (S), selenium (Se) and tellurium (Te). Generally, the III-V compound semiconductor substrate 14 will be procured commercially, with the exact p-type and n-type dopant for the substrate 14 being what is offered in the marketplace. The above p-type and n-type dopants can also be used for the various layers 16 which are epitaxially grown on the substrate 14. For these epitaxial layers 16, the exact dopant used will depend upon a number of factors including the existence of trap states produced by the dopant, and the diffusivity of the dopant at an epitaxial growth temperature, or at a subsequent annealing temperature.

The substrate 14 can have a thickness of, for example, 500 µm, and can be subsequently thinned to a thickness of 200 µm or less after fabrication of the photodetector elements 12. Thinning of the substrate 14 is useful to increase the transmission of the infrared light 100 through the substrate 14 to each photodetector element 12. Depending upon the wavelength of the infrared light 100 to be detected with the FPA 10, the substrate 14 can be thinned down to as little as 20-25 µm.

The III-V compound semiconductor layers 16 can be epitaxially grown on the substrate 14 by molecular beam epitaxy (MBE) at a growth temperature of about 400° C. To initiate the growth of the layers 16, a buffer layer 28 can be grown over the substrate 14 to a thickness of, for example, 0.5 µm. The buffer layer 28 can comprise GaSb or alternately aluminum gallium antimonide (AlGaSb) or aluminum gallium arsenide antimonide (AlGaAsSb) with a semiconductor alloy composition which is substantially lattice matched to the substrate 14. As an example, the buffer layer 28 can comprise $Al_{0.5}Ga_{0.5}As_{0.04}Sb_{0.96}$ when the substrate 14 comprises GaSb. The buffer layer 28 can be undoped, or alternately doped about the same as the substrate 14 (e.g. p-type doped with Zn or Be to $10^{17}$-$3\times10^{18}$ cm$^{-3}$). The buffer layer 28 can also comprise a part of the semiconductor p-n or p-i-n junction formed about a strained-layer superlattice 30 (SLS) which is epitaxially grown above the buffer layer 28.

Figure 2:
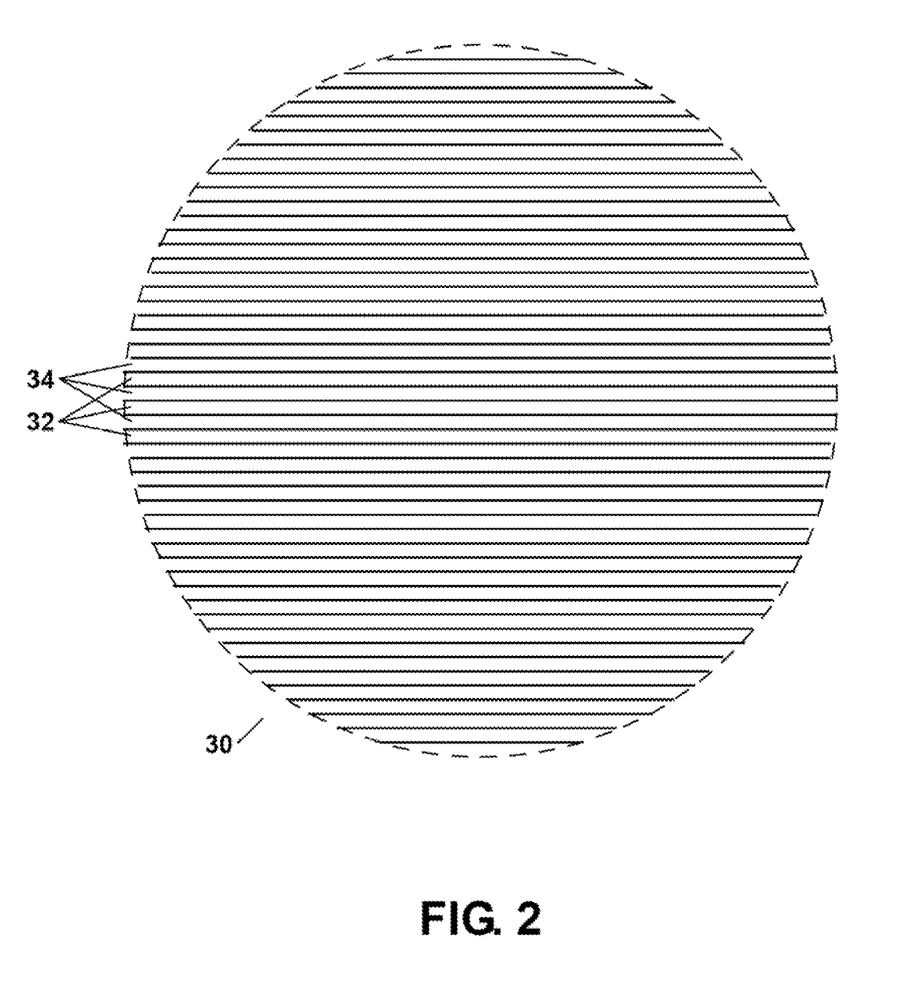
FIG. 2 shows an enlarged partial view of a strained-layer superlattice in the device of FIGS. 1A and 1B.

The SLS 30 comprises a plurality of alternating layers of indium arsenide (InAs) 32 and indium gallium antimonide ($In_xGa_{1-x}Sb$) 34 with an indium content x which is given by $0 \leq x \leq 0.5$, and with a thickness of each layer 32 and 34 which is generally less than 15 monolayers (i.e. about 9 nanometers). Altogether up to several hundred or more periods can be epitaxially grown to form the SLS 30, with each period comprising one InAs layer 32 and an adjacent $In_xGa_{1-x}Sb$ layer 34. An overall thickness of the SLS 30 can be up to about 20 μm or more, with the exact thickness depending upon a wavelength of the infrared light 100 to be detected. The term "$In_xGa_{1-x}Sb$" as used herein is intended to include ternary alloys when x>0, and is also intended to include the binary alloy GaSb when x=0.

A type-II energy band alignment is present at a heterointerface between the InAs and $In_xGa_{1-x}Sb$ layers 32 and 34. The type-II energy band alignment is characterized by a staggered energy band alignment with the bottom of the conduction band of the InAs layer 32 being below the top of the valence band of the adjacent $In_xGa_{1-x}Sb$ layer 34. This results in a superlattice energy band gap due to the separation between the confined hole states in the valence band of each $In_xGa_{1-x}Sb$ layer 34 and the confined electron states in the conduction band of each InAs layer 32. This forms a direct energy bandgap which can be adjusted by varying the widths of the individual layers 32 and 34, and also by varying the indium content x in the $In_xGa_{1-x}Sb$ layer 34.

By adjusting the direct energy bandgap of the SLS 30 by controlling the thickness of the layers 32 and 34 and/or the indium content x of the $In_xGa_{1-x}Sb$ layer 34, the FPA 10 can be tailored to detect infrared light 100 over a predetermined wavelength band which can be in the range of 3-25 μm. Wavelength bands of interest for the FPA 10 include a second atmospheric transmission window at 3-5 μm and a third atmospheric transmission window at 8-12 μm. The exact thickness of the layers 32 and 34 and the indium content x of the layer 34 will depend upon a particular wavelength band with which the FPA 10 is to be used and can be determined from practice of the present invention, or by modeling of the SLS 30 using commercial bandstructure modeling software (e.g. NEXTNANO3). The thicknesses of the layers 32 and 34 need not be the same. Increasing the period of the SLS 30 will increase the wavelength of the infrared light 100 which can be detected, with a minimum bandgap energy being calculated to occur when the thickness of the InAs layers 32 is approximately twice the thickness of the $In_xGa_{1-x}Sb$ layers 34 for x=0.

The SLS 30 is strained due to biaxial tension in the InAs layers 32 and biaxial compression ion the $In_xGa_{1-x}Sb$ layers 34. This strain decreases the superlattice energy band gap for given layer thicknesses of the InAs and $In_xGa_{1-x}Sb$ layers 32 and 34, with the biaxial tension in the InAs layers 32 lowering the conduction band energy, and with the biaxial compression in the $In_xGa_{1-x}Sb$ layers 34 raising the energy of the heavy hole valence band. Increasing the indium content x in the $In_xGa_{1-x}Sb$ layers 34 allows a smaller thickness to be used for the $In_xGa_{1-x}Sb$ layers, and this can be used to increase an absorption coefficient of infrared light 100 for the SLS. The ability to control the absorption wavelength using both the layer thicknesses of the InAs and $In_xGa_{1-x}Sb$ layers 32 and 34, and also by varying the indium content x in the $In_xGa_{1-x}Sb$ layers 34, allows considerable flexibility in adjusting these parameters while maintaining a predetermined absorption wavelength for detection of infrared light 100. The energy bandgap of the type-II SLS 30 used in the FPA 10 of the present invention can be varied over the range of 0-400 millielectron volts (meV).

In some embodiments of the present invention, the SLS 30 can be epitaxially grown by MBE with the layers 32 and 34 being not intentionally doped (i.e. intrinsic). This can be done to form a semiconductor p-i-n junction with the buffer layer 28 forming a p-type-doped region of the p-i-n junction, with the SLS 30 forming an intrinsic (i) region of the p-i-n junction, and with the impurity-doped region 22 forming an n-type doped region of the p-i-n junction. Those skilled in the art will understand that that an intrinsic region can still have some residual n-type or p-type doping which can be, for example, on the order of $10^{15}$-$10^{16}$ cm$^{-3}$. In other embodiments of the present invention, the SLS 30 can be doped p-type or n-type to a level of, for example, 1-5×$10^{17}$ cm$^{-3}$ to form a semiconductor p-n junction in conjunction with the impurity-doped region 22 which can be oppositely doped.

Returning to FIGS. 1A and 1B, a contact layer 36 can be epitaxially grown above the SLS 30 using MBE. The contact layer 36 can comprise InAs or GaSb. The thickness of the contact layer 36 can be, for example, 20 nanometers, with a doping level of, for example, 1-5×$10^{17}$ cm$^{-3}$. The contact layer 36 in this example of the present invention can have the same doping type as the substrate 14 and buffer layer 28 (e.g. p-type doping with Zn or Be). Alternately, the contact layer 36 can be undoped (i.e. not intentionally doped).

The substantially-planar passivation layer 18 in the example of FIGS. 1A and 1B can be epitaxially grown above the contact layer 36 by MBE at a growth temperature of about 400° C. The passivation layer 18 can comprise GaSb, AlGaSb or AlGaAsSb. The passivation layer 18 can be grown undoped (i.e. not intentionally doped).

After epitaxial growth of the passivation layer 18, the layer 18 can be patterned to form an opening 20 at the location where each photodetector element 12 will be formed. This can be done by forming a photolithographically-defined etch mask (not shown) over the passivation layer 18 and then etching down through the passivation layer 18 through openings formed etch mask. Etching of the passivation layer 18 can be performed using chemically-assisted ion beam etching.

After etching the openings 20, the etch mask can be removed, or left in place for use in forming the impurity-doped region 22. The impurity-doped region 22 forms a generally curved junction interface and electrically isolates each photodetector element 12 from adjacent photodetector elements 12. The term "electrically isolates" as used herein means that one side of the semiconductor p-n or p-i-n junction in each photodetector element 12 is not electrically connected to the same side of the semiconductor p-n or p-i-n junction of any of the remaining photodetector elements 12 in the 2-D array. Thus the electrically-isolated side of each photodetector element 12 can be independently electrically contacted to provide a photodetector output signal from that photodetector element 12 in response to the detection of any infrared light 100 by that photodetector element 12. Generally, the other side of each photodetector element 12 will have an electrical connection which is the same (i.e. common) for all of the photodetector elements 12.

The impurity-doped region 22 can be formed by ion implanting or thermally diffusing a dopant species which is of a type opposite that of the contact layer 36. As an example, when the contact layer 36 is p-type doped with Be, Mg, Zn or Cd, an n-type dopant such as Si, Ge, Sn, S, Se or Te can be used for the impurity-doped region 22. Alternately, when the contact layer 36 is n-type doped with Si, Ge, Sn, S, Se or Te, a p-type dopant such as Be, Mg, Zn or Cd can be used for the impurity-doped region 22. When ion implantation is used to form the impurity-doped region 22, ions of the selected dopant species can be implanted into the contact layer 36 at an energy of, for example, 130 keV and at a dosage of, for example, $2 \times 10^{13}$ cm$^{-2}$.

The dopant species used to form the impurity-doped region 22 converts the doping polarity, if any, of the contact layer 36 in the region 22 to be opposite that of the remainder of the contact layer 36 while otherwise maintaining the contact layer 36 intact across the 2-D array of photodetector elements 12. Similarly, a portion of the SLS 30 in the impurity-doped region 22 is converted to a doping type which is opposite that of the remainder of the SLS 30 while maintaining the SLS 30 intact across the 2-D array of photodetector elements 12. The cross-hatching shown in FIG. 1B is used simply to illustrate a difference in doping in the impurity-doped region 22 rather than a change in composition.

Crystal swelling can occur when dopant ions having a high atomic number are ion implanted into the contact layer 36 and the SLS 30. This problem can be alleviated by performing a shallow ion implant followed by a thermal annealing step at a temperature of about 450° C. which thermally diffuses the dopant ions downward into the SLS 30.

After forming the impurity-doped region 22, an electrode 24 can be deposited in each opening 20 to form an independent electrical connection to the photodetector element 12 located therein. The electrode 24 can comprise layers of titanium, platinum and gold deposited by evaporation or sputtering to an overall thickness of about 200 nm.

The substrate 14 can then be thinned to a thickness of less than 200 μm and, in some cases, down to about 20-25 μm to allow the infrared light 100 to be transmitted through the lower surface of the substrate 14 and into the photodetector elements 12. Thinning of the substrate 14 can be performed by a combination of mechanical polishing and wet etching. An anti-reflection coating (not shown) can then be optionally deposited over the lower surface of the substrate 14 to reduce the reflection of the infrared light 100 from this surface due to the relatively high index of refraction of the GaSb or GaAs used for the substrate 14. A common electrical connection can then be formed to the substrate 14 by depositing another Ti/Pt/Au electrode 26 on the lower surface of the substrate 14 as shown in FIG. 1B, or alternately above the substrate 14 in other embodiments of the present invention. The electrode 26 can be located outside the 2-D array of photodetector elements 12 as shown in FIG. 1B so that transmission of the infrared light 100 is not obstructed by the electrode 26.

Figure 4:
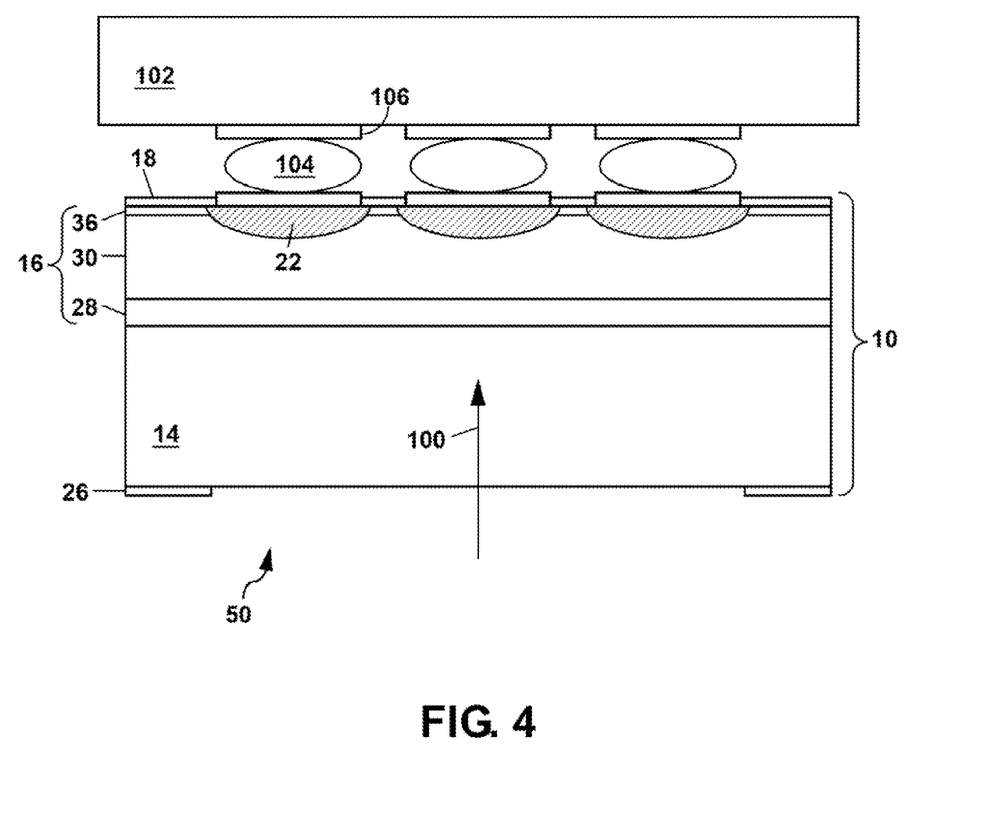
FIG. 4 shows a schematic cross-section view of the device of FIGS. 1A and 1B to illustrate how the infrared focal plane array photodetector can be mated to a readout integrated circuit (ROIC) chip using a plurality of solder bump interconnects to provide for readout of the photodetector elements in the infrared focal plane array photodetector.

After fabrication of the FPA 10 of FIGS. 1A and 1B with a two-dimensional (2-D) array of photodetector elements 12 (also termed photodiodes), the FPA 10 can be mated to a conventional readout integrated circuit (ROIC) 102 as shown in the schematic cross-section view of FIG. 4 to form a sensor chip assembly (SCA) 50. The ROIC 102 can be, for example, a complementary metal-oxide semiconductor (CMOS) integrated circuit (IC) which can be procured commercially, or custom designed for the FPA 10. The ROIC 102 can be used to readout current signals which are generated by each photodetector element 12 in response to detection of the infrared light 100. Additional functionality can be provided in the ROIC 102 including signal amplification, signal averaging, background compensation, calibration, data storage, serial or parallel data readout, etc. The attachment of the FPA 10 to the ROIC 102 can be performed using conventional flip-chip solder bump technology which uses a plurality of-solder bump interconnects 104 (e.g. comprising an indium solder) which are provided between the electrodes 24 and 106 to attach the FPA 10 and the ROIC 102 together. The completed SCA 50 can then be packaged.

In operation, the infrared light 100 can be imaged onto the FPA 10 which can be cooled below room temperature (e.g. to a temperature of about 200° K or less), with the light 100 passing through the III-V compound semiconductor substrate 14 and being absorbed in the SLS 30. The absorbed light produces carriers (i.e. electrons and holes) in the SLS 30 which are urged to move vertically towards the electrodes 24 and 26 where the carriers generate an electrical output signal for each photodetector element 12. The electrode 24 on top of each photodetector element 12 reflects any unabsorbed portion of the infrared light 100 back through the SLS 30 a second time, thereby approximately doubling the responsivity and quantum efficiency of each photodetector element 12. The 2-D array of photodetector elements 12 can thus provide an image of a scene of view captured via the infrared light 100. This image can be processed by the ROIC 102 and displayed or stored. The structure of the FPA 10 can effectively prevent surface recombination of carriers generated in each photodetector element 12, and this can increase the carrier lifetime, thereby reducing the background noise in each photodetector element 12 and increasing the detectivity of each photodetector element 12.

Figure 3A:
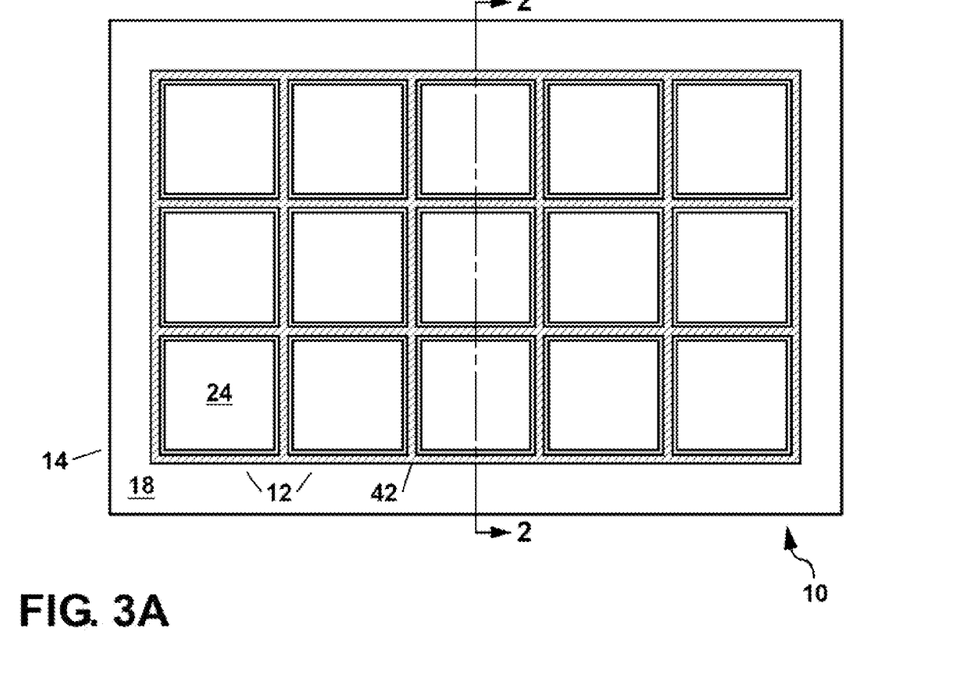
FIG. 3A shows a schematic plan view of a second example of an infrared focal plane array photodetector of the present invention.
Figure 3B:
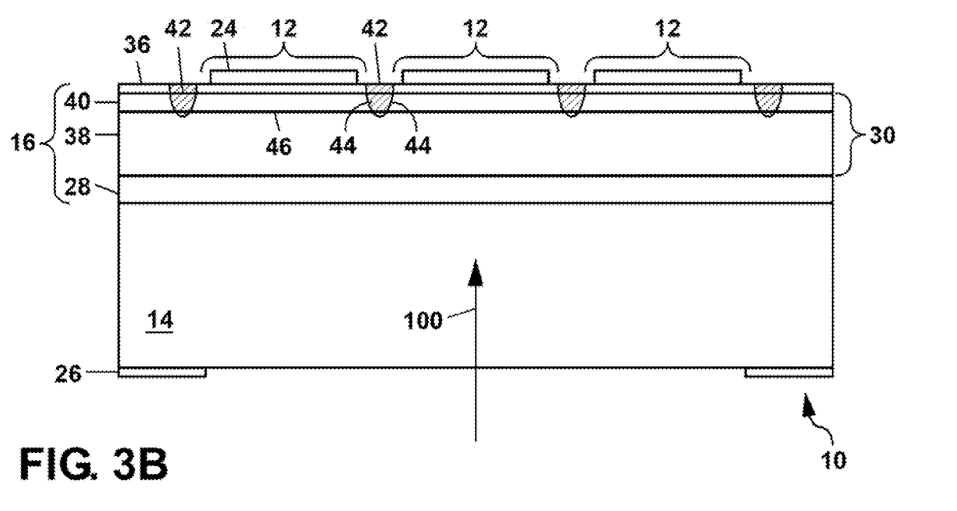
FIG. 3B shows a schematic cross-section view of the device of FIG. 3A along the section line 2-2 in FIG. 3A.

FIGS. 3A and 3B schematically illustrate in plan and cross-section views, respectively, a second example of the FPA 10 of the present invention. This second example of the FPA 10 can be formed on a III-V compound semiconductor substrate 14 (e.g. GaSb or GaAs) by epitaxially growing a plurality of III-V compound semiconductor layers 16 by MBE. These layers 16 include a buffer layer 28 which can be either GaSb, AlGaSb or AlGaAsSb as described previously, a contact layer 36 which can be either InAs or GaSb, and a strained-layer superlattice (SLS) 30 sandwiched between the buffer layer 28 and the contact layer 36. The substrate 14 and buffer layer 28 can be doped with a first doping type (e.g. p-type doping), and the contact layer 36 can be oppositely doped (e.g. n-type doping). In other embodiments of the present invention, the polarity of the various layers 28, 30 and 36 and the substrate 14 can be reversed from that described immediately above.

The SLS 30 comprises a plurality of alternating layers of InAs and In$_x$Ga$_{1-x}$Sb with $0 \leq x \leq 0.5$. The SLS 30 includes a first-grown portion 38 (i.e. a first-grown set of alternating InAs and In$_x$Ga$_{1-x}$Sb layers 32 and 34, respectively) which has the same doping type as the substrate 14 (e.g. p-type doped), and a last-grown portion 40 (i.e. a last-grown set of alternating InAs and In$_x$Ga$_{1-x}$Sb layers 32 and 34) which is oppositely doped (e.g. n-type doped). The SLS 30 can comprise up to hundreds of periods of the alternating InAs layers 32 and In$_x$Ga$_{1-x}$Sb layers 34 as has been described previously with reference to FIG. 2. An overall thickness of the SLS 30 can be, for example, up to about 20 μm, with the last-grown portion 40 of the SLS 30 being, for example, several tenths of a micron thick. In some embodiments of the present invention, an intrinsic region can be included in the SLS 30 although this is not shown in the example of FIG. 3B.

A two-dimensional (2-D) array of photodetector elements 12 (see FIG. 3A) can be formed from the plurality of III-V compound semiconductor layers 16. Each photodetector element 12 can be defined by an impurity-doped region 42 which surrounds that photodetector element 12 and electrically isolates it from the remaining photodetector elements in the 2-D array by forming a reverse-biased semiconductor p-n junction 44 at an interface with the contact layer 36 and with the last-grown portion 40 of the SLS 30. This reverse-biased semiconductor p-n junction 44 electrically isolates the photodetector element 12 from adjacent photodetector elements 12 by preventing any flow of an electrical current laterally through the impurity-doped region 42 while otherwise maintaining the contact layer 36 and the SLS 30 intact across the 2-D array of photodetector elements 12. The impurity-doped regions 42 formed about the various photodetector elements 12 in the 2-D array can overlap to form a meshwork pattern consisting of a series of trench-like impurity-doped regions 42 which cross at right angles as shown in FIG. 3A.

A photolithographically-defined mask can be provided over the contact layer in preparation for forming the impurity-doped region 42 about each photodetector element 12. The impurity-doped region 42 can then be formed by implanting or diffusing a dopant species of the first doping type (e.g. p-type doping with Zn or Be) into the plurality of III-V compound semiconductor layers through openings in the mask. In some instances, to avoid swelling III-V compound semiconductor layers which can occur with ion implantation, a shallow ion implant can be performed followed by a thermal diffusion step at a temperature of about 450° C. for a time period of, for example, one hour. The impurity-doped region 42 extends downward through the contact layer 36 and at least partway through the SLS 30. As shown in FIG. 3B, the impurity-doped region can extend completely through the last-grown portion 40 of the SLS 30 to electrically isolate a semiconductor p-n junction 46 of each photodetector element 12 which is formed at an interface between the first-grown and last-grown portions 38 and 40 of the SLS 30. Since the semiconductor p-n junction 46 is buried, surface recombination is substantially reduced or prevented in this example of the FPA 10.

An electrode 24 can be provided overtop the contact layer 36 in each photodetector element 12 to electrically contact that photodetector element 12. Another electrode 26 can be provided in electrical contact with the substrate 14 or with the first-grown portion 38 of the SLS 30 or in electrical contact with the buffer layer 28 to form a common electrical connection to each photodetector element 12 in the 2-D array. The electrodes 24 and 26 can comprise Ti/Pt/Au electrodes which can be deposited by evaporation or sputtering to an overall thickness of about 200 nm. Deposition of the electrode 26 can be performed after first thinning the GaSb substrate 14 to a thickness of less than 200 μm to improve the transmission of the infrared light 100 through the substrate 14. Additionally, an optional anti-reflecting coating can be applied to a lower surface of the substrate 14 to reduce a reflection of the infrared light 100 from the lower surface. After fabrication, the FPA 10 of FIGS. 3A and 3B can be attached to an ROIC 102 using conventional flip-chip solder bump technology as described previously with reference to FIG. 4, and then packaged for use.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for fabrication of an infrared focal plane array photodetector having a two-dimensional (2-D) array of photodetector elements, comprising the steps of:
   epitaxially growing a plurality of III-V compound semiconductor layers on a gallium antimonide (GaSb) substrate, with the III-V compound semiconductor layers including:
   a buffer layer;
   a strained-layer superlattice comprising a plurality of alternating layers of indium arsenide (InAs) and indium gallium antimonide ($In_xGa_{1-x}Sb$) with an indium content x in the range $0 \leq x \leq 0.5$;
   and a contact layer;
   electrically isolating each photodetector element from the remaining photodetector elements in the 2-D array of photodetector elements while maintaining the strained-layer superlattice contiguous across the entire 2-D array of photodetector elements by selectively doping a portion of the plurality of compound semiconductor layers within or about each photodetector element;
   depositing an electrode above the contact layer to independently electrically contact each photodetector element in the 2-D array of photodetector elements; and
   depositing another electrode proximate to the GaSb substrate to form a common electrical connection to each photodetector element in the 2-D array of photodetector elements.

2. The method of claim 1 further comprising epitaxially growing a passivation layer above the plurality of III-V compound semiconductor layers, and etching an opening through the passivation layer at the location of each photodetector element.

3. The method of claim 2 wherein the passivation layer comprises GaSb, aluminum gallium antimonide (AlGaSb) or aluminum gallium arsenide antimonide (AlGaAsSb).

4. The method of claim 1 wherein the GaSb substrate is doped with a first doping type, and the step of epitaxially growing the plurality of III-V compound semiconductor layers comprises doping the buffer layer with the first doping type, and doping the contact layer with a second doping type.

5. The method of claim 4 wherein the step of epitaxially growing the plurality of III-V compound semiconductor layers comprises doping a first-grown portion of the strained-layer superlattice with the first doping type, and doping a last-grown portion of the strained-layer superlattice with the second doping type.

6. The method of claim 1 wherein the step of epitaxially growing the plurality of III-V compound semiconductor layers comprises epitaxially growing the buffer layer with a composition of GaSb, AlGaSb or AlGaAsSb.

7. The method of claim 1 wherein the step of epitaxially growing the plurality of III-V compound semiconductor layers comprises epitaxially growing the contact layer with a composition of GaSb or InAs.

8. The method of claim 1 wherein the step of selectively doping the portion of the plurality of III-V compound semiconductor layers comprises ion implanting an impurity dopant into the portion of the plurality of III-V compound semiconductor layers.

9. The method of claim 8 further comprising a step for annealing the ion-implanted impurity dopant at a temperature of about 450° C. or less.

10. The method of claim 1 further comprising a step of thinning the GaSb substrate to a thickness of less than or equal to 200 microns.

* * * * *